Figure 1:
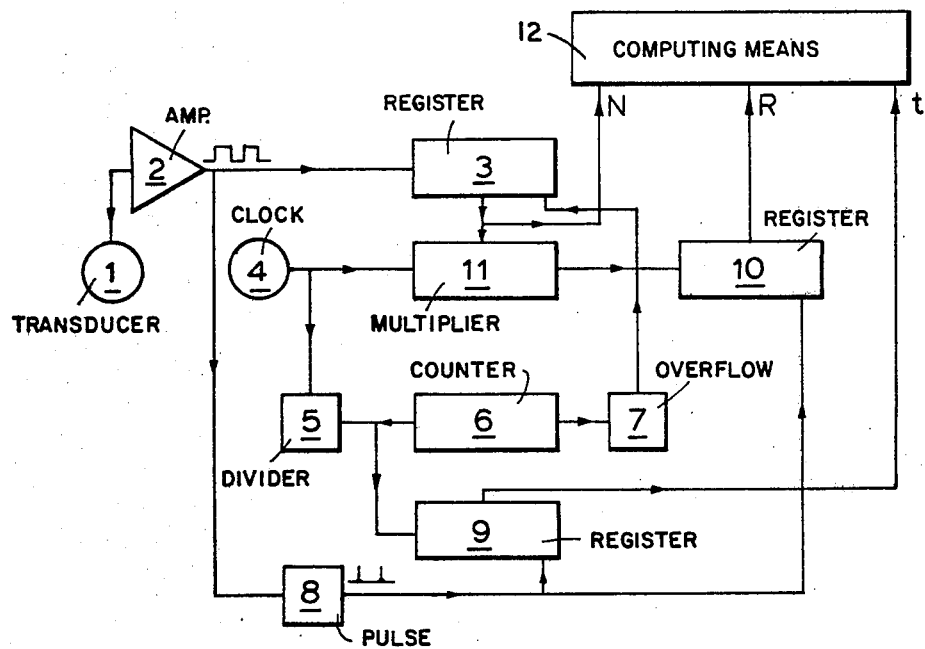

United States Patent [19]

Brearley et al.

[11] 4,162,443
[45] Jul. 24, 1979

[54] SPEED MEASURING SYSTEMS

[75] Inventors: Malcolm Brearley, Solihull; Roger J. Banks, Radford, both of England

[73] Assignee: Girling Limited, Birmingham, England

[21] Appl. No.: 846,761

[22] Filed: Oct. 31, 1977

[30] Foreign Application Priority Data

Nov. 9, 1976 [GB] United Kingdom ............... 46490/76

[51] Int. Cl.² ............................................. G01R 23/02
[52] U.S. Cl. ................................ 324/78 D; 324/186; 324/187
[58] Field of Search ................ 324/78 R, 78 D, 78 Z, 324/78 E, 186, 187; 328/129

[56] References Cited

U.S. PATENT DOCUMENTS

| | | | |
|---|---|---|---|
| 2,665,411 | 1/1954 | Frady, Jr. ............................ | 324/187 |
| 3,218,553 | 11/1965 | Peterson et al. ...................... | 324/187 |
| 3,611,134 | 10/1971 | McDowell ........................... | 324/187 |
| 3,909,714 | 9/1975 | Nakano ................................ | 324/186 |

Primary Examiner—M. Tokar
Attorney, Agent, or Firm—Scrivener, Parke, Scrivener & Clarke

[57] ABSTRACT

The frequency of a pulse signal is measured by counting the number of complete pulse cycles and measuring the fractional value of any incomplete pulse cycle occurring during a fixed sampling period, and summing said number of complete pulse cycles and said fractional value of any incomplete pulse cycle so as to obtain a total proportional to said frequency. The length of the incomplete pulse cycle is measured using a clock pulse signal having a base frequency which is multiplied by an integral fractor corresponding to the number of complete pulse cycles occurring during said sampling period, said integral factor being increased by one between successive pulse cycles and the length of each and every pulse cycle being measured in the corresponding clock pulse units. The period of successive complete pulse cycles is measured using said clock pulse signal, and the period measurements of all of said complete pulse cycles are summed and the total divided into the length of said incomplete pulse cycle to produce said fractional value. The frequency is measured in successive fixed sampling periods which are overlapped in time, each sampling period commencing at the beginning of a pulse cycle and successive sampling periods each overlapping the preceding sampling period by the extent of any incomplete pulse cycle at the end of said preceding sampling period.

20 Claims, 4 Drawing Figures

SPEED MEASURING SYSTEMS

This invention relates to a method of, and apparatus for measuring the frequency of a pulse signal, and is applicable to the measurement of any parameter, such as speed, that can be sensed by a transducer that produces a corresponding pulse signal at a related frequency.

Speed measuring systems are known which count the number of pulses occurring during a fixed sampling period and produce a corresponding speed measurement. Such systems are acceptable when a large number of pulses occur during the sampling period, either as a result of a high pulse frequency and/or a long sampling period. However, if the pulse frequency is low and cannot be increased by modification of the speed/pulse transducer, and the sampling period is short because of the need for a minimum time interval between successive speed measurements, then the accuracy of the measurements produced by these systems is low because they take no account of incomplete pulse cycles which may represent a substantial proportion of the sampling period.

Speed measuring systems are also known which measure the period of the pulses and produce a corresponding speed measurement. These systems can produce more accurate measurements at low pulse frequencies as compared with the known pulse counting systems, but they are more sensitive to irregularities in individual pulses such as produced by poorer quality speed/pulse transducers, and they tend to produce low accuracy measurements at high frequencies and to involve complexity in handling the non-linear relationship between the speed and pulse period.

The present invention aims to reduce or overcome these disadvantages of the known speed measuring systems, that is, it aims to allow successive speed measurements to be made at relatively short intervals over a wide range of pulse frequencies without any substantial deterioration in accuracy over the range, even though measurements at the lower frequencies may be based on just one or a few pulses.

The invention achieves this aim by providing a method of measuring the frequency of a pulse signal comprising counting the number of complete pulse cycles and measuring the fractional value of any incomplete pulse cycle occurring during a fixed sampling period, and summing said number of complete pulse cycles and said fractional value of any incomplete pulse so as to obtain a total proportional to said frequency.

This method is similar to the known pulse counting method in that it involves the counting of pulse cycles over a fixed sampling period, but it is more accurate, especially at low frequencies, because it also takes account of incomplete pulse cycles. Further, the method of the invention is similar to the known period measuring method in that it necessarily involves period measurement, the fractional value of the incomplete cycle being determined by measuring the period of a complete pulse cycle and the length of the incomplete pulse cycle and dividing one result by the other.

Preferably, the length of the incomplete cycle is measured using a clock pulse signal having a base frequency which is multiplied by an integral factor corresponding to the preceding number of complete pulse cycles occurring during the sampling period so that the length measurement is made with a suitably small clock pulse unit and is therefore suitably accurate. The problem of decreasing accuracy with increasing pulse frequency in the known period measuring method, is thereby avoided.

In a preferred embodiment, the clock pulse frequency is increased by increasing the integral multiplying factor by one between successive complete pulse cycles and the period of each and every cycle is measured in terms of the corresponding clock pulse unit so that the final incomplete pulse cycle will automatically be measured in the appropriate clock pulse units without having to predict in advance that it will in fact be the final pulse cycle in the sampling period.

The period of any complete pulse cycle can be measured using the clock pulse signal, and the fractional value of the incomplete pulse cycle can then be determined allowing for any difference in the clock pulse units used in measuring the complete and incomplete pulse cycles. However, it is preferred to measure the period of successive complete pulse cycles using clock pulses at the base frequency or a fixedly related frequency and to sum the period measurements for all of the complete pulse cycles so that the final period measurement is multiplied by an integral factor equal to the number of complete pulse cycles occurring during the sampling period. If this period measurement is then used with the length measurement of the incomplete pulse cycle made using clock pulses multiplied by an integral factor equal to the number of complete pulse cycles during the sampling period, the two integral multiplying factors will cancel out, thereby simplifying subsequent computation. Summing of successive period measurements is also particularly advantageous because it tends to average out irregularities in the input pulse signal due, for example, to speed/pulse transducer faults.

The fixed sampling period can be arranged to commence at a particular point in the input pulse cycle, for example, at the leading edge of the pulse. However, there is then likely to be a dead period between the end of one sampling period and the beginning of the next, and at low input pulse frequencies this may be a serious disadvantage. It is preferred therefore that successive sampling periods are overlapped in time by the extent of the final incomplete pulse cycle, the length measurement of this incomplete cycle being used to preset the sampling period timer for the next sampling period.

The invention also consists in apparatus for carrying out the method of the invention comprising timing means for timing a fixed sampling period, first counting means for counting the number of complete pulse cycles occurring during said sampling period, a clock pulse generator, second counting means for counting clock pulses from said generator during a complete pulse cycle so as to obtain a measure of the period of said complete cycle, third counting means for counting clock pulses from said generator during any incomplete pulse cycle so as to obtain a measure of the length of said incomplete pulse cycle, and computing means for dividing the length count of said incomplete pulse cycle from said third counting means by the period count of said complete pulse cycle from said second counting means so as to obtain a fractional value for said incomplete pulse cycle, and for summing said count of complete pulse cycles from said first counting means with said fractional value so as to obtain a total proportional to said speed.

Said first, second and third counting means may be pulsed registers that produce digital outputs suitable for computer processing to determine said frequency without making any substantial demands on the main processing operations of the computer. Apparatus according to the invention is therefore particularly suitable for digital speed control systems or speed related control systems such as engine management or anti-skid braking systems, where shaft speed signals form a major or minor variable.

Figure 2:
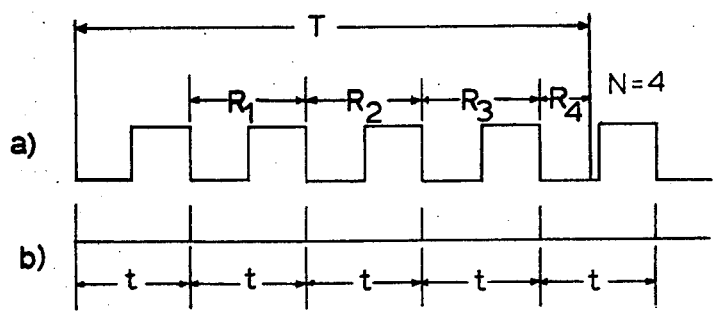
Figure 3:
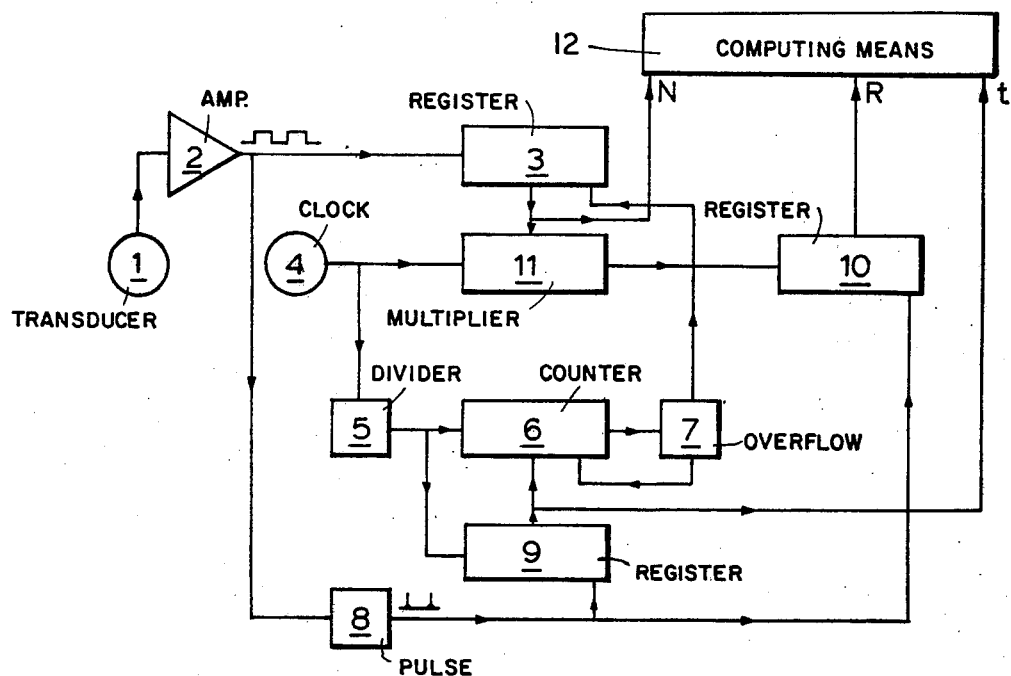
Figure 4:
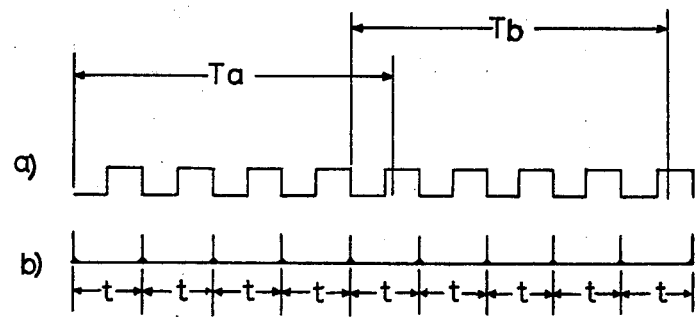

The invention will now be described by way of example with reference to the accompanying drawings, in which:

FIG. 1 is a schematic block diagram of speed measuring apparatus according to one embodiment of the invention, FIG. 2 shows waveforms produced in the embodiment of FIG. 1, FIG. 3 is a schematic block diagram showing a modification of the apparatus of FIG. 1, and FIG. 4 shows waveforms produced in the modified embodiment of FIG. 3.

The speed measuring apparatus of FIG. 1 is adapted to measure speed by analysis of a pulse signal having a frequency proportional to said speed. The pulse signal in FIG. 1 is generated by a transducer 1 which may, for example, sense vehicle wheel speed or engine speed. The pulse signal is amplified by amplifier 2 and is fed to a register 3 which counts the number of input pulses N occurring during a fixed sampling period T equal to the period of the lowest frequency to be measured. The sampling period T is timed using clock pulses produced by a clock pulse generator 4 and sub-divided in frequency in a divider unit 5. These clock pulses are counted in a counter 6 which is set to trigger an overflow detector 7 at a preset count corresponding to the required sampling period T. When said present count is detected, the overflow detector 7 produces a reset pulse which resets register 3.

The pulse signal from amplifier 2 is also fed to a pulse generator 8 which responds to the trailing edge of each input pulse by producing a corresponding reset pulse which is fed to two further registers 9 and 10. Register 9 counts clock pulses from the divider unit 5, the count reached each time when the register is reset corresponding to the period t of the preceding input pulse from the transducer 1. Register 10 counts clock pulses from the clock pulse generator 4 that have been multiplied in frequency in a multiplier 11 by a variable factor which is set by the register 3 and is equal to the number of input pulses counted by register 3 at any instant during the sampling period. The count R of the register 10 at the end of the sampling period will correspond to the length r of the last input pulse cycle (usually incomplete) multiplied by the factor N, equal to the number of complete input pulse cycles during that sampling period, that is, $R = Nr$.

The frequency of the clock pulse signal from generator 4 is substantially higher than the maximum frequency of the input pulses from transducer 1 so as to ensure acceptable resolution in the period measurements made by registers 9 and 10.

The input pulse count N, the whole pulse period count t and the part pulse count R are read repeatedly by a general purpose digital computer 12. The count N in register 3 and the count R in register 10 are read at the end of the sampling period T before being reset, and the count t from register 9 is read at the end of each pulse cycle before being reset. This information is processed by the computer to devise a high resolution figure for the speed sensed by transducer 1 in the manner described with reference to FIG. 2.

FIG. 2 illustrates a typical input pulse waveform (curve a) shown here of constant frequency to simplify the following description but which in practice will be subject to changes of input frequency. Taking the simplest case, suppose that the period of the input pulses is constant and the start of a pulse cycle coincides with the beginning of the sampling period T.

Register 3 counts the number of whole pulse cycles $N = 4$, that are completed during the sampling period T and this is read by the computer.

During each whole pulse cycle, register 9 counts the sub-clock pulses from divider 5 and attains a whole pulse period count t before being reset at the end of the cycle by a reset pulse from pulse generator 8 (see FIG. 2, curve b). The computer reads the count t for successive whole pulse cycles and sums them so as to obtain a final count $Nt = 4t$, at the end of the sampling period T.

Register 10 counts sub-clock pulses from multiplier 11 during successive pulse cycles and is reset with register 9 at the end of each cycle. The frequency $k_n$ of the sub-clock pulses is increased from one cycle to the next according to the relationship $k_n = (Nk_o/K)$, where $k_o$ is the frequency of the clock generator 4, N is the current count of whole pulses in register 3, and K is a constant set by the multiplier which is greater than the maximum value of N and which is set so that the count $R_1$ at the end of the second whole cycle is equal to the count t from register 9. The counts R and t are therefore made in the same clock units during the second pulse cycle, but the count R during successive pulse cycles is made in increasingly smaller clock units corresponding to the increase in the frequency multiplying factor N. This leads to improved resolution in measuring the length r of the last part pulse which in this example is the fifth pulse, during which $N = 4$ and the sub-clock pulse frequency $k_4 = 4k_o/K$. The count $R_4$ is therefore measured in clock units four times smaller than the count t, that is, $R_4 = 4r$.

The computer processes the count R for the part pulse so as to express it as a fraction of the period t of a whole pulse. In doing this, it automatically compensates for the different clock units of the two counts by dividing the count R by the sum total count Nt of the whole pulse periods, thereby cancelling out the frequency pulse multiplying factor N. In this example, the multiplying factor $N = 4$ incorporated in the count $R_4 = 4r$, is cancelled out by dividing it by the sum of the periods of the four complete pulse cycles 4t, thereby producing the fractional value $(R_4/4t) = (r/t)$ of the fifth part pulse cycle.

The computer then obtains a value for the sum of the number of complete and fractional pulse cycles $N + (r/t)$ and produces a corresponding speed value which allows for the speed/pulse characteristics of the transducer 1.

A high resolution measurement of speed is therefore obtained without making any heavy demands on computer time, thereby allowing the main computer effort to be dedicated to control algorithms which utilise the data collected to perform control functions.

The apparatus can operate in a speed range from $N = 1$ up to N equal to any preset figure, typically 15 or 255 depending on the required resolution, the frequency input range and the delay time which can be tolerated.

Typically, the apparatus has a frequency range 40 to 640 Hz, where N max is 15 and the sampling period is set at 25 mS. The clock generator 4 has a base frequency slightly in excess of 160 KHz.

By accumulating the period readings t during the sampling period T, a constant resolution is obtained even at high input frequencies. Also, by measuring the length of the last part pulse cycle with clock pulses of increasing frequency with increasing number N of whole pulse cycles, the part pulse measurement is made at near constant resolution so that the fraction calculation is never made using low numbers and accuracy is maintained throughout the input frequency range.

For real control systems or dynamic speed measurement the input pulse rate may be continually varying, but the illustrated apparatus has the capability of producing an averaged period count over the sampling period T, and a measure of this averaging process is carried over into the calculation of the part pulse fraction r/t.

In FIG. 2 curve a, the input pulse waveform is shown in the ideal case where it is synchronised with the start of a sampling period T. However, in the general case, there will be a phase difference between internal clock pulses and the input pulse waveform. Previous systems of measurement have been proposed in which the next sampling period has been delayed until a new cycle starts, when they can be re-synchronised. However, when the input frequency is almost as low as the sampling rate, the necessary delay is so long as to almost halve the normal sampling rate so that for certain control systems, the increased dead time may be unacceptable. This problem is overcome by modifying the embodiment of FIG. 1 as shown in FIG. 3.

In the modified embodiment of FIG. 3, successive sampling periods Ta, Tb are overlapped as shown in FIG. 4, thereby increasing the data rate rather than increasing dead time by spacing out sampling periods to obtain phase co-incidence. The overlap is simply obtained by transfer of the partially completed period count of register 9 into the fixed period counter 6 when the latter signals the end of the sampling period Ta, transfer being triggered by an enable signal from the overflow detector 7. The next sampling period Tb is thereby preset so that it effectively commences from the beginning of the last part pulse in the last sampling period Ta. Register 9 continues to store the partially completed period count and completes the count as the first period count t in the next sampling period Tb. By these means all sampling periods are synchronised to active edges of the incoming pulse train, and a faster sampling rate is produced, which is useful at low speeds where the overlap may be a sizeable fraction of the sampling period.

The illustrated apparatus has been described as including a general purpose digital computer which collects data from the registers and calculates the speed values. The processing times for these operations is relatively small and enables the computer to operate to control another main control programme. However, the apparatus can be modified so as to use the computer more, the lower frequency registers 3 and 9 being removed and their functions being taken over by the computer programme. Further, if a sufficiently fast computer is used even register 10 can be replaced by suitable programming so that only the speed/pulse transducer 1 and the clock pulse oscillator 4 need to be provided externally of the computer.

In yet another alternative embodiment of the invention, the computer of the illustrated embodiments might be replaced by a digital divider.

We claim:

1. A method of measuring the frequency of a pulse signal comprising counting the number of complete pulse cycles and measuring the fractional value of any incomplete pulse cycle occurring during a fixed sampling period, and summing said number of complete pulse cycles and said fractional value of any incomplete pulse cycle so as to obtain a total proportional to said frequency, said fractional value of an incomplete pulse cycle being measured by counting clock pulses occurring during said incomplete pulse cycle and comparing this with clock pulses occurring during a complete pulse cycle.

2. A method as claimed in claim 1 in which the length of any incomplete pulse cycle is measured using a clock pulse signal having a base frequency which is multiplied by an integral factor corresponding to the number of complete pulse cycles occurring during said sampling period so that the measurement is made in suitably small clock pulse units.

3. A method as claimed in claim 2 in which said integral multiplying factor is increased by one between successive pulse cycles and the length of each and every pulse cycle is measured in the corresponding clock pulse units.

4. A method as claimed in claim 2 in which the period of a complete pulse cycle is measured using said clock pulse signal, and in which the length of said incomplete pulse cycle is divided by the period of said complete pulse cycle to produce said fractional value after making allowance for said integral multiplying factor.

5. A method as claimed in claim 4 in which the period of successive complete pulse cycles is measured using said clock pulse signal and the period measurements of all of said complete pulse cycles are summed and the total divided into the length of said incomplete pulse cycle to produce said fractional value.

6. A method as claimed in claim 1 in which said frequency is measured in successive fixed sampling periods which are overlapped in time, each sampling period commencing at the beginning of a pulse cycle and successive sampling periods each overlapping the preceding sampling period by the extent of any incomplete pulse cycle at the end of said preceding sampling period.

7. A method of measuring a parameter comprising sensing a parameter using a transducer so as to produce a pulse signal with a frequency related to the parameter, and measuring the frequency of said pulse signal by the method claimed in claim 1.

8. A method as claimed in claim 7 in which said parameter is speed which is sensed by a transducer that produces a pulse signal with a frequency related to said speed.

9. Apparatus for measuring the frequency of a pulse signal comprising timing means for timing a fixed sampling period, first counting means for counting the number of complete pulse cycles occurring during said sampling period, a clock pulse generator, second counting means for counting clock pulses from said generator during a complete pulse cycle so as to obtain a measure of the period of said complete cycle, third counting means for counting clock pulses from said generator during any incomplete pulse cycle so as to obtain a measure of the length of said incomplete pulse cycle, and computing means for dividing the length count of said incomplete pulse cycle from said third counting means by the period count of said complete pulse cycle from said second counting means so as to obtain a fractional value of said incomplete pulse cycle, and for summing said count of complete pulse cycles from said first counting means with said fractional so as to obtain a total proportional to said frequency.

10. Apparatus as claimed in claim 9 in which said timing means is adapted to commence said sampling period at a particular edge of a pulse cycle, and which includes reset means that produces a reset pulse in response to said particular edge of each pulse cycle.

11. Apparatus as claimed in claim 10 which includes multiplying means for multiplying the base frequency of the clock pulses from said generator by an integral factor before passing the resultant sub-clock pulses to said third counting means, said integral factor being derived from said first counting means and corresponding to the number of complete pulse cycles occurring during said sampling period.

12. Apparatus as claimed in claim 11 in which said third counting means counts said sub-clock pulses during each and every pulse cycle and is reset at the end of each complete pulse cycle by said reset pulse, said first counting means serving to increase said multiplying factor by one between successive pulse cycles after a first complete pulse cycle.

13. Apparatus as claimed in claim 11 in which said second counting means counts clock pulses of a fixed frequency during each and every pulse cycle and is reset at the end of each complete pulse cycle by said reset pulse.

14. Apparatus as claimed in claim 13 in which said computing means sums the counts of the period of successive complete pulse cycles from said second counting means during said sampling period and divides this into the count from said third counting means corresponding to the length of said incomplete pulse cycle, thereby producing said fractional value.

15. Apparatus as claimed in claim 10 in which said timing means produces a preset signal at the end of said sampling period, which signal causes the timing means to be preset to a time corresponding to the length of the incomplete pulse cycle so that the timing means commences operation from this point in the next sampling period.

16. Apparatus as claimed in claim 14 in which said timing means produces a preset signal at the end of said sampling period, which signal causes the timing means to be preset to a time corresponding to the length of the incomplete pulse cycle so that the timing means commences operation from this point in the next sampling period, and in which said timing means is a counter counting the same clock pulses as said second counting means and in which said preset signal causes the count in the second counting means to be transferred to the counter of the timing means.

17. Apparatus as claimed in claim 9 including a transducer that senses a parameter and produces a pulse signal at a frequency related to said parameter and feeds said signal to said first, second and third counting means.

18. Apparatus as claimed in claim 17 in which said transducer produces a pulse signal at a frequency related to speed.

19. A method as claimed in claim 1 in which the same clock pulse signals are used to measure said fractional value of an incomplete pulse cycle and said fixed sampling period.

20. Apparatus as claimed in claim 9 in which said timing means comprises a counter that counts clock pulses from said clock pulse generator.

* * * * *